US006218768B1

(12) United States Patent
Lee et al.

(10) Patent No.: US 6,218,768 B1
(45) Date of Patent: Apr. 17, 2001

(54) POWER ULTRASONIC TRANSDUCER

(75) Inventors: Yang-Lae Lee; Pil-Woo Heo; Eui-Su Lim, all of Daejeon-Si (KR)

(73) Assignee: Korea Institute of Machinery & Materials, Daejeon-Si (KR)

( * ) Notice: Subject to any disclaimer, the term of this patent is extended or adjusted under 35 U.S.C. 154(b) by 0 days.

(21) Appl. No.: 09/225,568

(22) Filed: Jan. 5, 1999

(30) Foreign Application Priority Data

Nov. 23, 1998 (KR) .......... 98-50170

(51) Int. Cl.[7] .......... H01L 41/08

(52) U.S. Cl. .......... 310/325; 310/322

(58) Field of Search .......... 310/322, 323, 310/325, 334, 337

(56) References Cited

U.S. PATENT DOCUMENTS 2,962,695 * 11/1960 Harris .......... 310/322 X
4,754,441 * 6/1988 Butler .......... 310/322 X
4,779,020 * 10/1988 Konno et al. .......... 310/325
4,996,674 * 2/1991 Thompson .......... 310/325 X
5,030,873 * 7/1991 Owen .......... 310/322 X
5,172,344 * 12/1992 Ehrlich .......... 310/325 X

* cited by examiner

*Primary Examiner*—Mark O. Budd
(74) *Attorney, Agent, or Firm*—Arent Fox Kintner Plotkin & Kahn PLLC

(57) ABSTRACT

A power ultrasonic transducer according to the present invention includes: an ultrasonic generator comprised of two pairs of piezoceramic elements which are adjoined to be coupled to each other on the same shaft and a countermass attached at the both ends of the piezoceramic elements; a hollow type body having a length of integer times of half wavelength, in which the ultrasonic generator is positioned; a cylindrical transmitting rod having a length of integer times of half wavelength and for connecting the one side of the body with the one side of the ultrasonic generator to be fixed on the both sides of the ultrasonic generator, respectively; and a threaded stud for securing an electric wire for power supply at the one side end of the outside of the body, the electric wire for power supply passing through the countermass and the interior of the transmitting rod each positioned in the interior of the body to be wired to the piezoceramic elements.

3 Claims, 2 Drawing Sheets

POWER ULTRASONIC TRANSDUCER

BACKGROUND OF THE INVENTION

1. Field of the Invention

The present invention relates to a power ultrasonic transducer, and more particularly, to a power ultrasonic transducer which is used for the execution of ultrasonic cleaning, the promotion of chemical reaction and the like.

2. Discussion of Related Art

Generally, a conventional Langevin type transducer, which is configured to insert a piezoelectric element between two metals and to be secured by a bolt, has been widely used in this field. However, since this type of transducer can not be directly used in the water, it should be used only in case of being attached on a wall surface of a cleaning vessel. In addition, since the Langevin type transducer generates an ultrasonic wave by utilizing a longitudinal vibration, this results in the limitation of ultrasonic power generated from the transducer.

In the Langevin type transducer, hence, there occurs a disadvantage in that transducer array should be used so as to produce a high power. In this case, if these transducers are not synchronized with each other during operating period, the life of the adjacent transducers influenced by the distortion force generated from the vibration of any specific transducer can be shortened.

On the other hand, another research is executed by U.S. Pat. No. 4,537,511 (in 1985) which improves the above problems suffered from the conventional Langevin type transducer. This is an improved transducer which can produce a high power and is directly used in the water. In this effort, the transducer includes an ultrasonic generator which has a longitudinal vibration mode by using a piezoelectric element and a hollow type rod which has a length of integer(n) times of half wavelength(lambda/2) and is coupled to the end of one side of the ultrasonic generator, to thereby radiate the ultrasonic wave in a radial direction.

However, the transducer according to the U.S. Pat. No. 4,537,511 can produce a higher power, when compared with the conventional Langevin type transducer, but since the other end of the hollow type rod as a free end is exposed into a medium, an undesired ultrasonic wave in a longitudinal direction is radiated, which of course results in the loss of energy.

To solve this problem, another research is executed by U.S. Pat. No. 5,200,666 (in 1993) and European Pat. No. EP 455837 (in 1991), wherein a piezo type ultrasonic generator is attached on the both end sides of a hollow type rod, respectively, to thereby generate an higher ultrasonic power in a radial direction. Here, the hollow type rod has a length of integer(n) times of half wavelength(lambda/2), in the same manner as the above.

In this case, if the characteristics such as the resonant frequencies and impedances of the two end-sided ultrasonic generators are not accurately consistent with each other, there exists a difference in phases and amplitudes of the longitudinal vibration generated from each of the two ultrasonic generators, so the efficiency of the transducer is inevitably reduced. Meanwhile, upon manufacturing of the transducer, it is very difficult to make two ultrasonic generators have equal characteristics.

On the other hand, FIG. 3 is a perspective view of a prior art transducer introduced by Uchino, which has a quite different structure and application from the conventional transducers as mentioned above. The disc-shaped transducer which is reported by Uchino in IEEE Vol. 44, No. 3,1997, pp. 597–605, 1997, is results in the increment of displacement thereof. In this effort, the shape of body (brass endcap) is newly designed, thus to allow the transducer to increase the ultrasonic power.

However, the transducer by Uchino takes a disc type having a diameter of about 10 mm and is used for a small actuator. Further, since the transducer includes the ultrasonic generator which is comprised only of a piezoceramic having about 1 mm in thickness and about 10 mm in diameter and utilizes a radial mode of the piezoceramic, it is apparent that it is difficult to manufacture the piezoceramic of the same thickness having about 50 mm or more in diameter. This results in a fundamental limitation in the increment of ultrasonic power from the transducer.

SUMMARY OF THE INVENTION

Accordingly, the present invention proposes a newly power ultrasonic transducer that substantially improves one or more of the problems due to limitations and disadvantages of the related arts.

An object of the invention is to provide the power ultrasonic transducer which is a rod type transducer used in the water for the ultrasonic cleaning of large capacity and the promotion of chemical reaction, includes a single ultrasonic generator to thereby solve the characteristic consistency problem generated upon the installation of two end-sided ultrasonic generator. The ultrasonic generator being comprised of a piezoceramic and a countermass, utilizes a thickness mode of the piezoceramic, increases the number of the piezoceramic to thereby increase the ultrasonic power and also the whole length(body length) thereof is extended from at least about 500 mm to the integer times of a half wavelength as a length of a transmitting rod is extended to integer times of a half wavelength, to thereby increase the ultrasonic power thereof.

To accomplish these objects, a power ultrasonic transducer includes an ultrasonic generator comprised of two pairs of piezoceramic elements which are adjoined to be coupled to each other on the same shaft and a countermass attached at the both ends of the piezoceramic elements; a hollow type body having a length of integer(n) times of half wavelength(lambda/2), in which the ultrasonic generator is positioned; a cylindrical transmitting rod having a length of integer(n) times of half wavelength (lambda/2) and for connecting the one side of the body with the one side of the ultrasonic generator to be fixed on the both sides of the ultrasonic generator, respectively; and a threaded stud for securing an electric wire for power supply at the one side end of the outside of the body, the electric wire for power supply passing through the countermass and the interior of the transmitting rod each positioned in the interior of the body to bewired to pass through the piezoceramic elements.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description to explain the principles of the drawings.

DETAILED DESCRIPTION OF PREFERRED EMBODIMENT

Reference will now be made in detail to the preferred embodiments of the present invention, examples of which are illustrated in the accompanying drawings.

Hereinafter, an explanation of a power ultrasonic transducer according to the present invention will be in detail discussed with reference to FIGS. 1 and 2.

Figure 1:
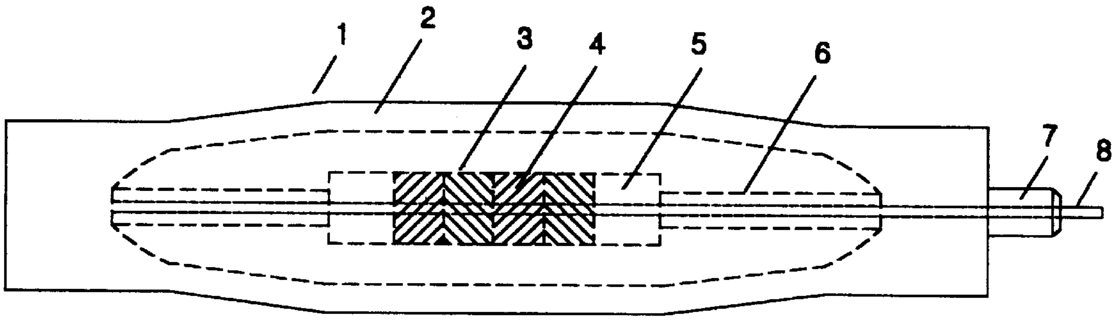
FIG. 1 is a schematic view of a first type of power ultrasonic transducer embodied according to the present invention.

FIG. 1 is a schematic view of a first type of power ultrasonic transducer embodied according to the present invention. In construction, the first type of power ultrasonic transducer includes an ultrasonic generator 3 comprised of two pairs of piezoceramic elements 4 and the countermass 5 attached at the both ends of the piezoceramic elements 4, a hollow type body 2 in which the ultrasonic generator 3 is positioned, and a cylindrical transmitting rod 6 having a length of integer(n) times of half wavelength (lambda/2) the transmitting rod 6 connecting the sides of the body 2 with the sides of the ultrasonic generator 3.

At this time, the body also has a length of integer(n) times of half wavelength (lambda/2).

The first type power ultrasonic transducer requires a single ultrasonic generator 3, so that characteristic inconsistence caused upon the installation of two end-sided ultrasonic generators by the U.S. Pat. No. 4,537,511 can be eliminated.

Moreover, the first type power ultrasonic transducer has a high displacement body structure, as shown in FIG. 1, in which the inter and outer diameters of the intermediate portion thereof can be designed to be larger than those of the both ends thereof. In this case, since the displacement in the intermediate flat portion of the body is twice as high as that of U.S. Pat. No. 5,200,666, the first type power ultrasonic transducer can produce the ultrasonic power in which sound pressure in the water is doubled, in the radial direction.

Figure 2:
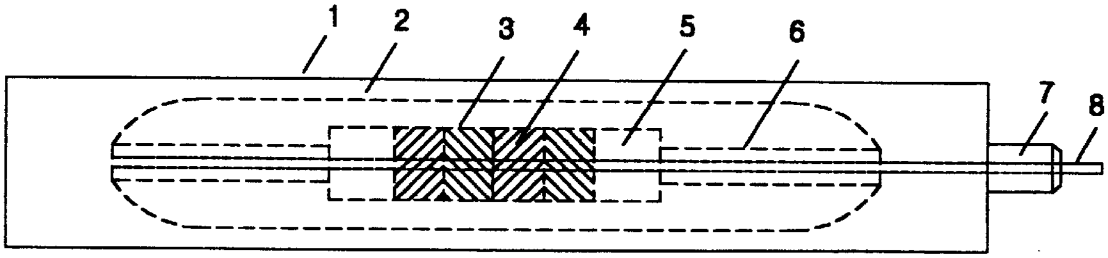
FIG. 2 is a schematic view of a second type of power ultrasonic transducer embodied according to the present invention.
Figure 3:
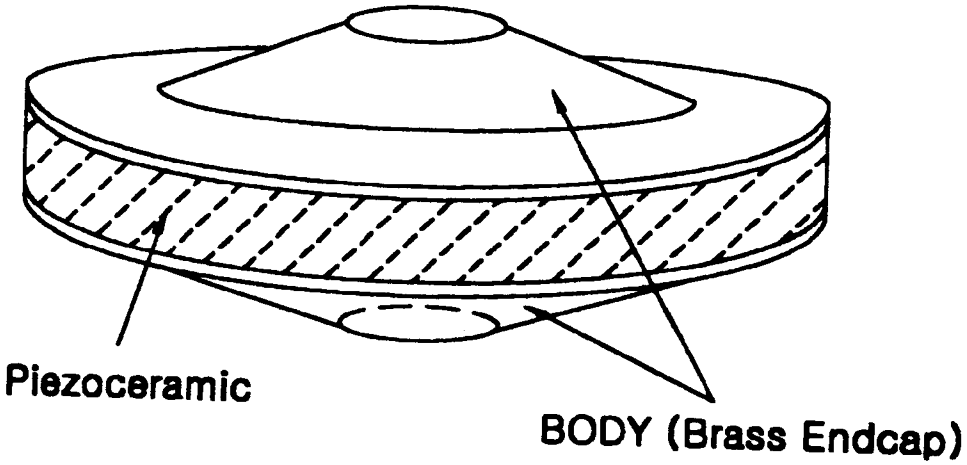
FIG. 3 is a perspective view of a prior art transducer introduced by Uchino.

FIG. 2 is a schematic view of a second type of power ultrasonic transducer embodied according to the present invention. If the displacement is high in the transducer as shown in FIG. 1, the erosion on the surface of the body is likely to be formed. To prevent such the erosion, the second type of power ultrasonic transducer as shown in FIG. 2 can be suggested.

In construction, the second type of power ultrasonic transducer includes an ultrasonic generator 3 comprised of two pairs of piezoceramic elements 4 which are adjoined to be coupled to each other on the same shaft and a countermass 5 attached at the both ends of the piezoceramic elements 4; a hollow type body 2 having a length of integer(n) times of half wavelength (lambda/2), in which the ultrasonic generator 3 is positioned; a cylindrical transmitting rod 6 having a length of integer(n) times of half wavelength (lambda/2) the transmitting rod 6 connecting the sides of the body 2 with the sides of the ultrasonic generator 3 and a threaded stud 7 for securing an electric wire for power supply 8 at the one side end of the outside of the body 2, the electric wire for power supply 8 passing through the countermass 5 and the interior of the transmitting rod 6 each positioned in the interior of the body 2 to be wired to pass through the piezoceramic elements 4.

In this case, the second type power ultrasonic transducer has a body structure, as shown in FIG. 2, in which the inter and outer diameters of the intermediate portion and the both ends thereof are almost same.

As noted above, a power ultrasonic transducer according to the present invention requires a single ultrasonic generator, so that characteristic inconsistence caused upon the installation of two end-sided ultrasonic generators by the U.S. Pat. No. 4,537,511 can be eliminated.

In addition, the power ultrasonic transducer has a body structure, as shown in FIG. 1, in which the inter and outer diameters of the intermediate portion thereof can be designed to be larger than the both ends thereof, so that since the displacement in the intermediate portion of the body is twice as high as that of U.S. Pat. No. 5,200,666, the power ultrasonic transducer can produce the ultrasonic power in which sound pressure in the water is doubled.

As discussed above, the comparison of the power ultrasonic transducer according to the present invention with Uchino's transducer is obtained by the following table:

TABLE

| Classification | Uchino's Transducer | Transducer according to the present invention |
|---|---|---|
| Type | disc | rod |
| Use | small actuator, and usable in the air | cleaning for large capacity, and usable in the water |
| Size | diameter of about 10 mm | a minimum length of about 500 mm or more |
| Electric Power | several W | 1000 W or more |
| Comparison of Advantage/Disadvantage | a) disc type<br>b) ultrasonic generator comprised only of a piezoceramic having about 10 mm in diameter and utilizing a radial mode thereof<br>c) body size restricted by the size of piezoceramic<br>d) because of the limitation of size of piezoceramic, increment of ultrasonic wave output is impossible | a) rod type<br>b) ultrasonic generator comprised of a piezoceramic and a countermass and utilizing thickness mode of the piezoceramic,<br>c) increment of the ultrasonic wave output by increasing the number of the piezoceramic, and extension of the whole length of transducer by extending a length of a transmitting rod to integer times of a half wavelength, to thereby increase the ultrasonic wave output<br>d) large size of transducer and increment of electric power |

It will be apparent to those skilled in the art that various modifications and variations can be made in a power ultrasonic transducer of the present invention without departing from the spirit or scope of the invention. Thus, it is intended that the present invention cover the modifications and variations of this invention provided they come within the scope of the appended claims and their equivalents.

What is claimed is:

1. A power ultrasonic transducer comprising:

two pairs of piezoceramic elements adjoined to be coupled to each other on the same shaft;

an ultrasonic generator comprised of piezoceramic elements and a countermass attached at the both ends of them;

a hollow type body having a length of integer times of a half wavelength, in which ultrasonic generator is positioned;

a cylindrical transmitting rod having a length of integer times of a half wavelength and the cylindrical transmitting rod connecting the sides of the hollow type body with the sides of the ultrasonic generator; and a threaded stud for securing an electric wire for power supply at the one side end of the outside of said hollow type body, said electric wire for power supply passing through said countermass and the interior of said transmitting rod each positioned in the interior of said hollow type body to be wired said piezoceramic elements.

2. The transducer as defined in claim 1, wherein said hollow type body forms an intermediate portion having inter and outer diameters larger than the both ends thereof.

3. The transducer as defined in claim 1, wherein said hollow type body has no difference between the inter and outer diameters of the intermediate portion thereof and those of the both ends thereof.

* * * * *